(12) United States Patent
Mosendz et al.

(10) Patent No.: US 12,256,557 B2
(45) Date of Patent: Mar. 18, 2025

(54) OVONIC THRESHOLD SWITCH SELECTORS WITH ELECTRODES INCLUDING CARBON AND METAL

(71) Applicant: WESTERN DIGITAL TECHNOLOGIES, INC., San Jose, CA (US)

(72) Inventors: Oleksandr Mosendz, Campbell, CA (US); James Reiner, Palo Alto, CA (US); Bruce Terris, Sunnyvale, CA (US); John Read, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 545 days.

(21) Appl. No.: 17/579,147

(22) Filed: Jan. 19, 2022

(65) Prior Publication Data

US 2023/0232639 A1 Jul. 20, 2023

(51) Int. Cl.
*H10B 63/00* (2023.01)
*H10N 70/00* (2023.01)
*H10N 70/20* (2023.01)

(52) U.S. Cl.
CPC ........... *H10B 63/24* (2023.02); *H10N 70/231* (2023.02); *H10N 70/823* (2023.02); *H10N 70/8828* (2023.02)

(58) Field of Classification Search
CPC ........ H10B 63/24; H10B 61/10; H10B 63/10; H10B 63/80; H10N 70/231; H10N 70/823; H10N 70/8828; H10N 50/10; H10N 50/85; H10N 70/20; H10N 70/24; H10N 70/245; H10N 70/826; H10N 70/8822; H10N 70/8825
See application file for complete search history.

(56) References Cited

U.S. PATENT DOCUMENTS

| | | | |
|---|---|---|---|
| 9,379,163 B1 * | 6/2016 | Arayashiki | H10B 63/84 |
| 9,634,245 B2 * | 4/2017 | Gotti | H10N 70/063 |
| 9,991,315 B2 * | 6/2018 | Terai | H10B 63/845 |
| 10,199,434 B1 | 2/2019 | Lee et al. | |
| 10,249,683 B1 * | 4/2019 | Lille | H10N 70/231 |
| 10,354,710 B2 | 4/2019 | Petti et al. | |
| 10,381,409 B1 | 8/2019 | Zhou et al. | |
| 10,381,411 B2 | 8/2019 | Lille | |
| 10,381,559 B1 | 8/2019 | Zhou et al. | |
| 10,580,976 B2 | 3/2020 | Takahashi et al. | |

(Continued)

OTHER PUBLICATIONS

Notification of Transmittal of The International Search Report and Written Opinion of the International Searching Authority for International Patent Application No. PCT/US2022/030051, mailed Oct. 17, 2022, 9 pages.

(Continued)

*Primary Examiner* — Caleb E Henry
(74) *Attorney, Agent, or Firm* — THE MARBURY LAW GROUP PLLC

(57) ABSTRACT

A memory device includes a memory material portion, and an ovonic threshold switch selector element. The ovonic threshold switch selector element includes a first carbon-containing electrode comprising carbon and a metal, a second carbon-containing electrode comprising the carbon and the metal, and an ovonic threshold switch material portion located between the first electrode and the second electrode.

7 Claims, 11 Drawing Sheets

(56) References Cited

U.S. PATENT DOCUMENTS

| | | | |
|---|---|---|---|
| 11,031,435 B2 | 6/2021 | Grobis et al. | |
| 11,088,170 B2 | 8/2021 | Zhang et al. | |
| 2005/0030800 A1* | 2/2005 | Johnson | H10N 70/231 |
| | | | 257/E45.002 |
| 2007/0096090 A1* | 5/2007 | Dennison | H10B 63/24 |
| | | | 257/42 |
| 2007/0105267 A1* | 5/2007 | Karpov | H10B 63/82 |
| | | | 438/95 |
| 2011/0309320 A1* | 12/2011 | Peters | H10N 70/8828 |
| | | | 257/E47.001 |
| 2012/0002461 A1* | 1/2012 | Karpov | G11C 13/0007 |
| | | | 365/158 |
| 2014/0217351 A1* | 8/2014 | Bresolin | H10N 70/8828 |
| | | | 438/102 |
| 2016/0093804 A1 | 3/2016 | Petz et al. | |
| 2017/0005262 A1* | 1/2017 | Hwang | H10N 70/023 |
| 2017/0154675 A1* | 6/2017 | Kang | G06F 3/0679 |
| 2017/0242660 A1* | 8/2017 | Katoh | H04L 9/0662 |
| 2017/0244031 A1 | 8/2017 | Jeong et al. | |
| 2017/0288140 A1 | 10/2017 | Karpov et al. | |
| 2018/0144793 A1* | 5/2018 | Jo | G11C 13/0002 |
| 2019/0027201 A1 | 1/2019 | Petti et al. | |
| 2019/0189688 A1 | 6/2019 | Lille | |
| 2019/0288192 A1 | 9/2019 | Takahashi et al. | |
| 2019/0355902 A1 | 11/2019 | Chan et al. | |
| 2019/0362785 A1 | 11/2019 | Hu et al. | |
| 2020/0350364 A1 | 11/2020 | Wan et al. | |
| 2020/0388752 A1 | 12/2020 | Bai et al. | |
| 2021/0151506 A1 | 5/2021 | Kim et al. | |
| 2021/0159248 A1 | 5/2021 | Zhang et al. | |
| 2021/0167285 A1 | 6/2021 | Horii et al. | |
| 2021/0210497 A1 | 7/2021 | Yang et al. | |
| 2021/0375989 A1 | 12/2021 | Chiang et al. | |
| 2021/0408020 A1 | 12/2021 | Makala et al. | |

OTHER PUBLICATIONS

U.S. Appl. No. 16/910,799, filed Jun. 24, 2020, SanDisk Technologies LLC.

U.S. Appl. No. 16/913,717, filed Jun. 26, 2020, SanDisk Technologies LLC.

U.S. Appl. No. 16/913,766, filed Jun. 26, 2020, SanDisk Technologies LLC.

U.S. Appl. No. 17/075,980, filed Oct. 21, 2020, Western Digital Technologies, Inc.

* cited by examiner

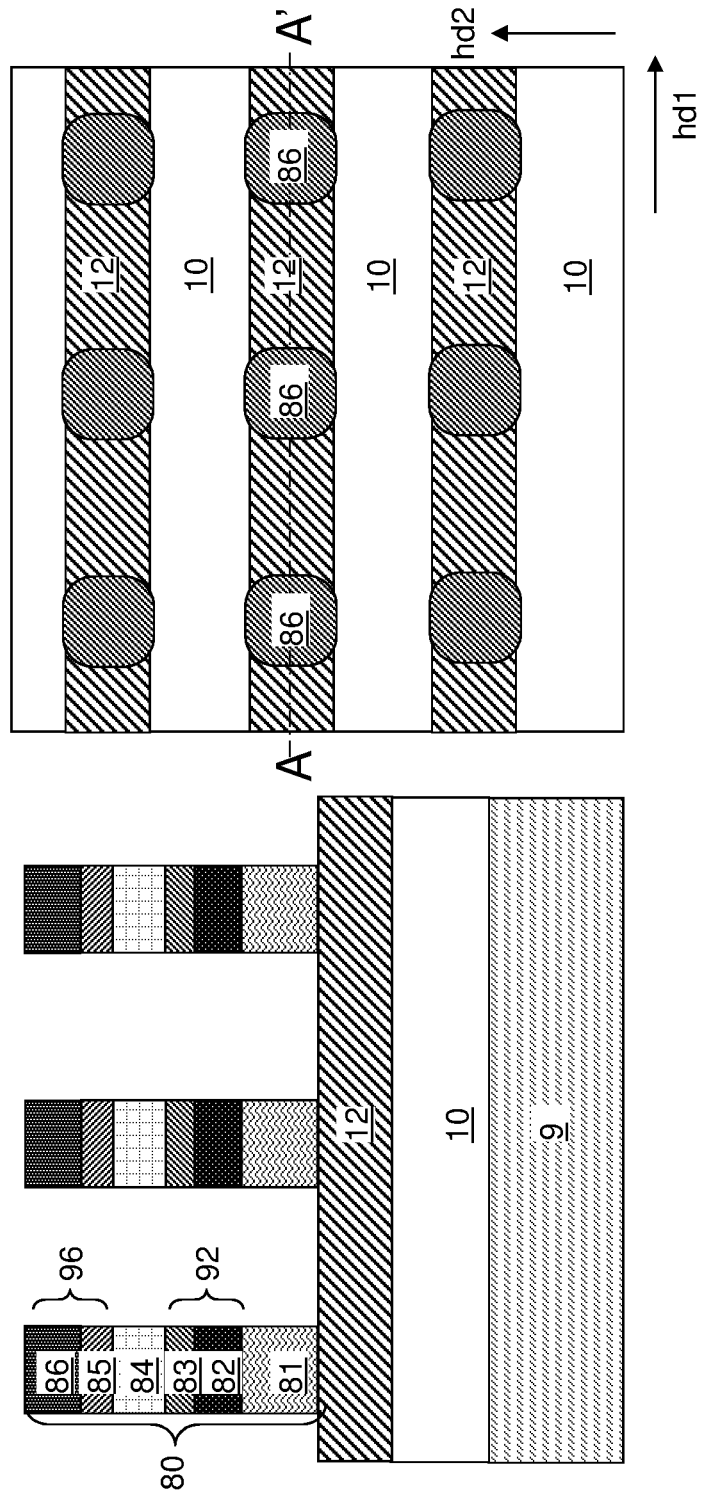

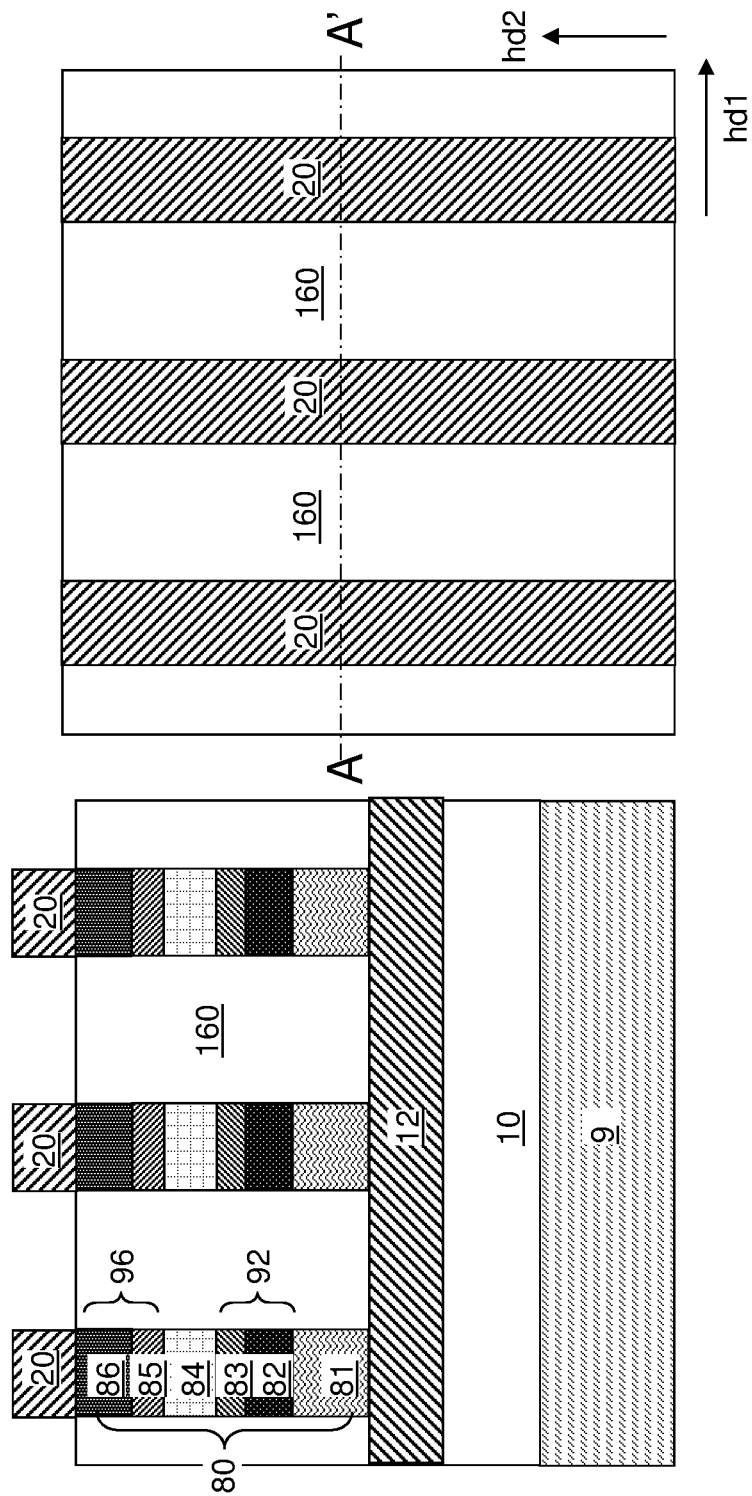

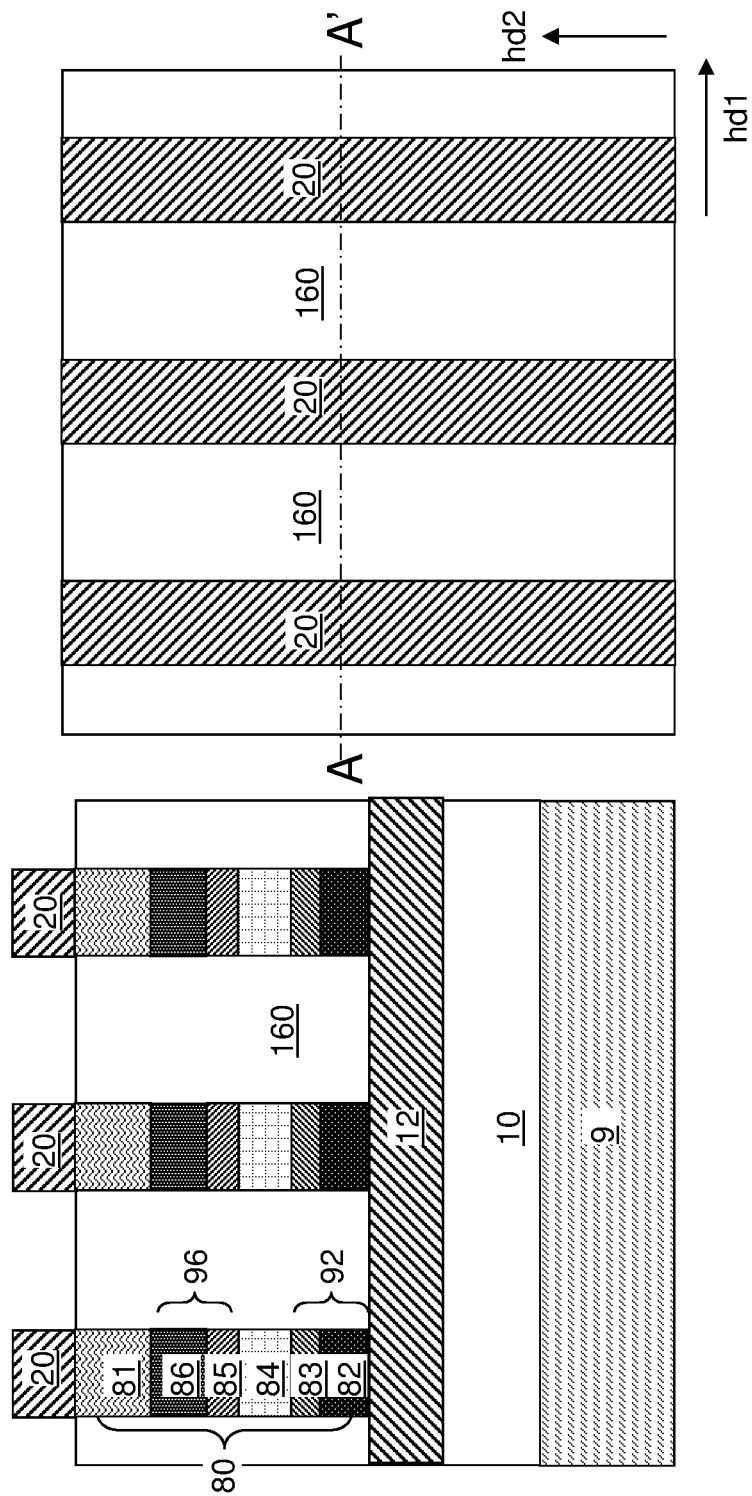

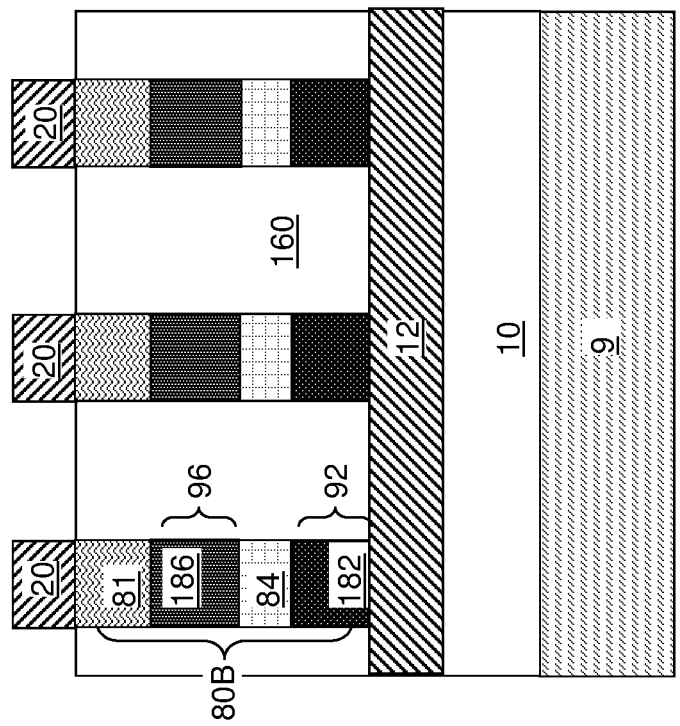
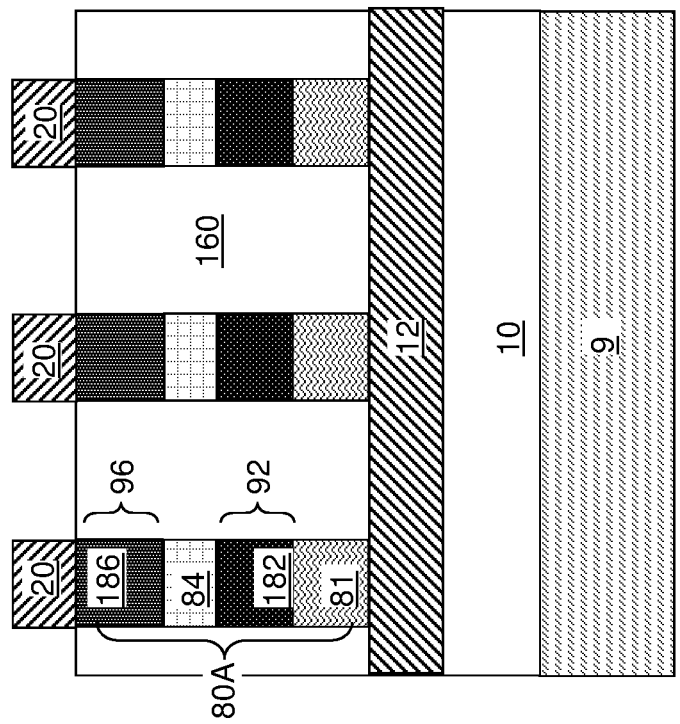
FIG. 8B
FIG. 8A

OVONIC THRESHOLD SWITCH SELECTORS WITH ELECTRODES INCLUDING CARBON AND METAL

FIELD

The present disclosure relates generally to the field of semiconductor devices and specifically to a memory device including ovonic threshold switch selectors.

BACKGROUND

Various memory devices, such as magnetoresistive random access memory (MRAM) and phase change memory (PCM) devices use selector elements. In one type of a MRAM device, spin-transfer torque (STT) refers to an effect in which the orientation of a magnetic layer in a magnetic tunnel junction or spin valve is modified by a spin-polarized current. Generally, electric current is unpolarized with electrons having random spin orientations. A spin polarized current is one in which electrons have a net non-zero spin due to a preferential spin orientation distribution. A spin-polarized current can be generated by passing electrical current through a magnetic polarizer layer. When the spin-polarized current flows through a free layer of a magnetic tunnel junction or a spin valve, the electrons in the spin-polarized current can transfer at least some of their angular momentum to the free layer, thereby producing a torque on the magnetization of the free layer. When a sufficient amount of spin-polarized current passes through the free layer, spin-transfer torque can be employed to flip the orientation of the spin (e.g., change the magnetization) in the free layer. A resistance differential of a magnetic tunnel junction between different magnetization states of the free layer can be employed to store data within the MRAM cell depending if the magnetization of the free layer is parallel or antiparallel to the magnetization of the polarizer layer, also known as a reference layer.

A phase change memory (PCM) device (also known as a phase change random access memory "PCRAM" or "PRAM") is a type of non-volatile memory device that stores information as a resistivity state of a material that can be in different resistivity states corresponding to different phases of the material. The different phases can include an amorphous state having high resistivity and a crystalline state having low resistivity (i.e., a lower resistivity than in the amorphous state). The transition between the amorphous state and the crystalline state can be induced by controlling the rate of cooling after application of an electrical pulse that renders the phase change material amorphous in a first part of a programming process. The second part of the programming process includes control of the cooling rate of the phase change material. If rapid quenching occurs, the phase change material can cool into an amorphous high resistivity state. If slow cooling occurs, the phase change material can cool into a crystalline low resistivity state.

SUMMARY

According to an aspect of the present disclosure, a memory device includes a memory material portion, and an ovonic threshold switch selector element. The ovonic threshold switch selector element includes a first carbon-containing electrode comprising carbon and a metal, a second carbon-containing electrode comprising the carbon and the metal, and an ovonic threshold switch material portion located between the first electrode and the second electrode.

BRIEF DESCRIPTION OF THE DRAWINGS

FIG. 3A is a vertical cross-sectional view of the exemplary structure after formation of memory pillar structures according to the first embodiment of the present disclosure.

FIG. 3B is a top-down view of the exemplary structure of FIG. 3A. The vertical plane A-A' is the plane of the vertical cross-sectional view of FIG. 3A.

FIG. 5A is a vertical cross-sectional view of the exemplary structure after formation of second conductive lines according to the first embodiment of the present disclosure.

FIG. 5B is a top-down view of the exemplary structure of FIG. 5A. The vertical plane A-A' is the plane of the vertical cross-sectional view of FIG. 5A.

FIG. 6A is a vertical cross-sectional view of an alternative configuration of the exemplary structure after formation of second conductive lines according to the first embodiment of the present disclosure.

FIG. 6B is a top-down view of the alternative configuration of the exemplary structure of FIG. 6A. The vertical plane A-A' is the plane of the vertical cross-sectional view of FIG. 6A.

FIGS. 8A and 8B are vertical cross-sectional view of alternative configurations of a second exemplary structure after formation of second conductive lines according to a second embodiment of the present disclosure

DETAILED DESCRIPTION

Figure 1A:
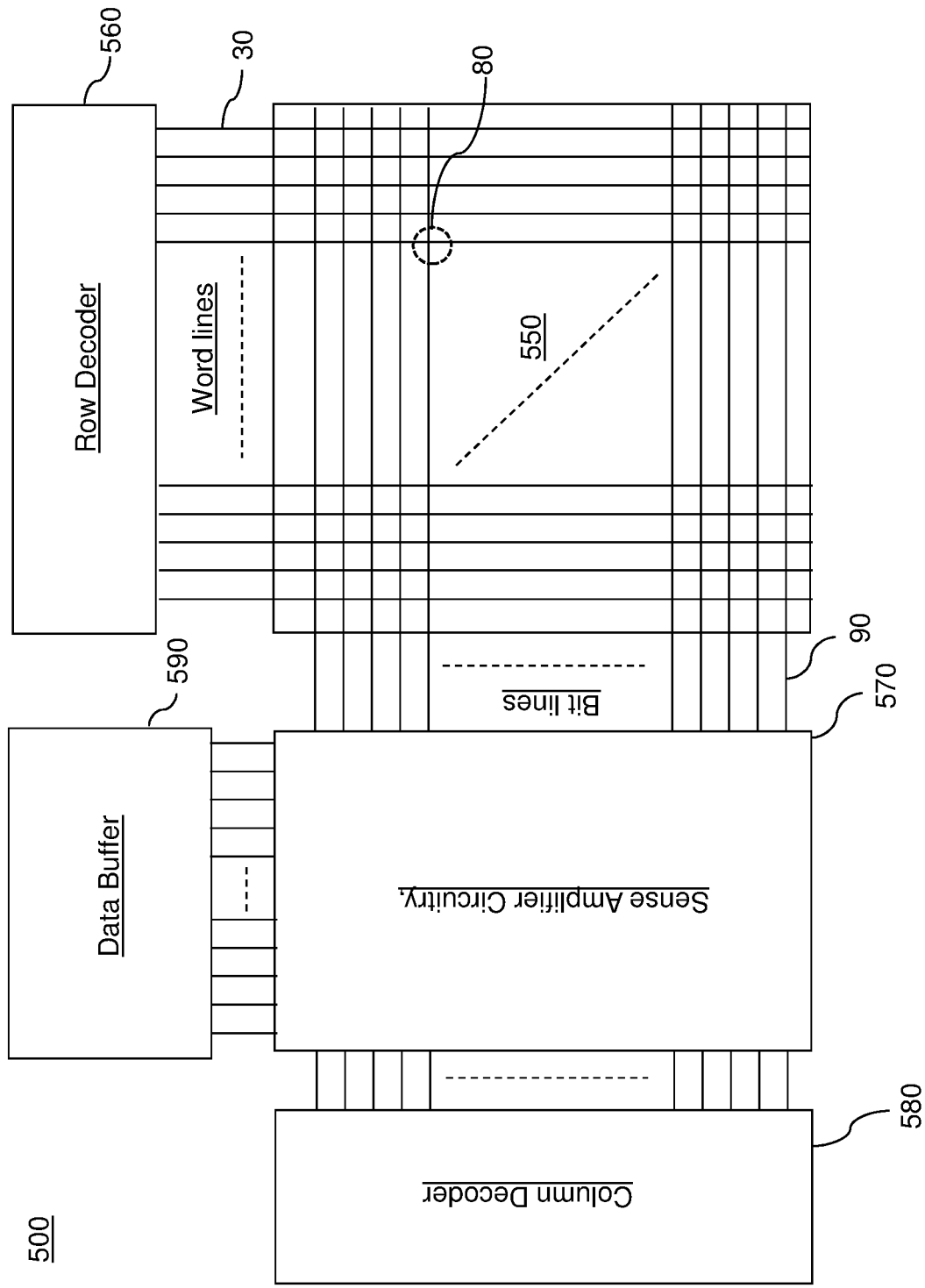
FIG. 1A is an exemplary circuit schematic of a memory device including a two-dimensional or a three-dimensional array of memory elements of one embodiment of the present disclosure.

Embodiments of the present disclosure are directed to a memory device including ovonic threshold switch selector elements with high electrical conductivity current spreading layers and methods of forming the same, the various aspects of which are described below. The memory devices of various embodiments may be magnetoresistive random access memory (MRAM) devices, phase change memory (PCM) devices or resistive random access memory (ReRAM) devices.

The drawings are not drawn to scale. Multiple instances of an element may be duplicated where a single instance of the element is illustrated, unless absence of duplication of elements is expressly described or clearly indicated otherwise. Unless otherwise indicated, a "contact" between elements refers to a direct contact between elements that provides an edge or a surface shared by the elements. Ordinals such as "first," "second," and "third" are employed merely to identify similar elements, and different ordinals may be employed across the specification and the claims of the instant disclosure. A same reference numeral refers to a same element or a similar element. Unless otherwise noted, elements with a same reference numeral are presumed to have a same material composition. As used herein, all thermal properties are measured at 300 degrees Kelvin unless otherwise specified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from $1.0 \times 10^{-3}$ S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{2}$ S/cm. As used herein, an "insulating material" or a "dielectric material" refers to a material having electrical conductivity much less than $1.0 \times 10^{-3}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{2}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-3}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to an electrically conductive material including at least one metal element therein. All measurements for electrical conductivities are made at the standard condition.

FIG. 1A is a schematic diagram of a memory device 500. In one example described below, the memory device is a MRAM device. However, ReRAM and/or PCM devices may be used instead. The memory device 500 includes memory cells which may be located in memory pillar structures 80 in an array configuration. In one embodiment, each memory cell may comprise the STT memory cell of the MRAM device. The memory device can be configured as a random access memory device. As used herein, a "random access memory device" refers to a memory device including memory cells that allow random access, i.e., access to any selected memory cell upon a command for reading the contents of the selected memory cell.

The memory device 500 of an embodiment of the present disclosure includes a memory array region 550 containing an array of memory pillar structures 80 located at the intersection of the respective word lines 20 and bit lines 12. The memory device 500 may also contain a row decoder 560 connected to the word lines 20, a programming and sensing circuitry 570 (e.g., a sense amplifier and other bit line control circuitry) connected to the bit lines 12, a column decoder 580 connected to the bit lines 12 and a data buffer 590 connected to the sense circuitry. Multiple instances of the memory pillar structures 80 are provided in an array configuration in the phase change memory device 500.

Figure 1B:
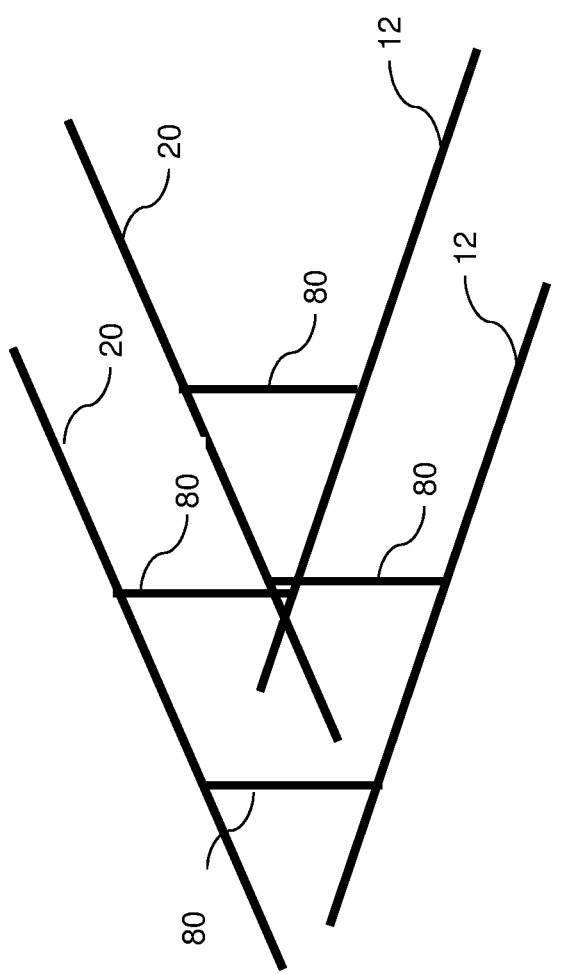
FIG. 1B is a schematic perspective view of a cross-point array of memory elements located between word lines and bit lines in the memory device of FIG. 1A.

FIG. 1B illustrates a cross-point array configuration for a group of memory pillar structures 80. Each memory pillar structure 80 includes a memory material, such as a STT memory cell stack, a phase change material or another material described below, having at least two different resistivity states. The memory material portion is provided between a first electrode, such as a first electrically conductive line 12, and a second electrode, such as a second electrically conductive line 20. A plurality of first electrically conductive lines 12 comprise a first set of parallel metal lines extending along a first horizontal direction (e.g., bit line direction), and a plurality of second electrically conductive lines 20 comprise a second set of parallel metal lines extending along a second horizontal direction (e.g., word line direction). The second horizontal direction may, or may not, be perpendicular to the first horizontal direction. In one embodiment, the first electrically conductive lines 12 may comprise the bit lines, and the second electrically conductive lines 20 may comprise the word lines. Alternatively, the first electrically conductive lines 12 may comprise the word lines, and the second electrically conductive lines 20 may comprise the bit lines.

Figure 2B:
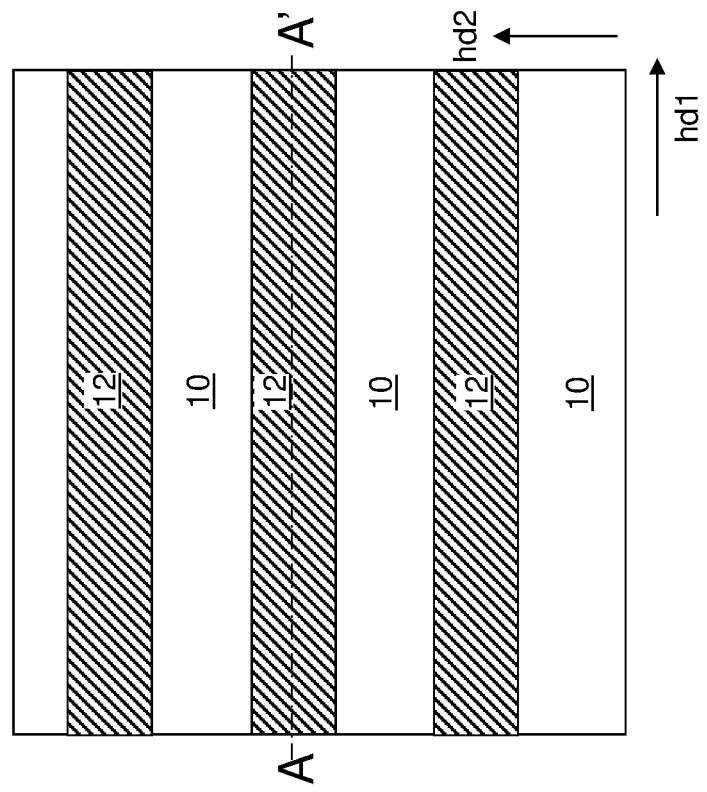
FIG. 2B is a top-down view of the exemplary structure of FIG. 2A. The vertical plane A-A' is the plane of the vertical cross-sectional view of FIG. 2A.
Figure 2A:
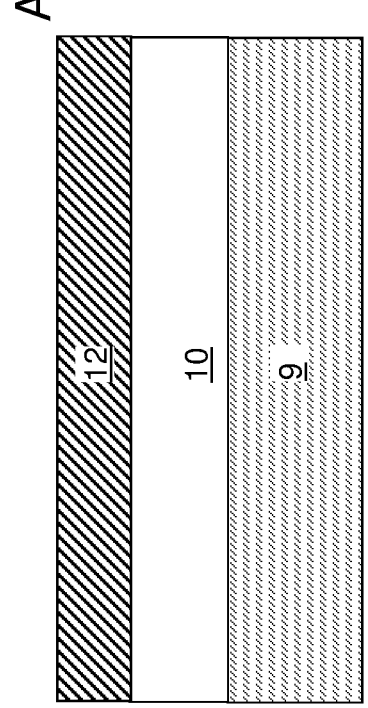
FIG. 2A is a vertical cross-sectional view of an exemplary structure for forming a memory device after formation of first electrically conductive lines according to a first embodiment of the present disclosure.

Referring to FIGS. 2A and 2B, a first exemplary structure for forming a memory device according to the first embodiment is illustrated. An insulating layer 10 can be formed over a top surface of a substrate 9. The substrate 9 can include a semiconductor material, an insulating material, or a conductive material. In one embodiment, the substrate 9 can be a commercially available semiconductor wafer, or a portion of a commercially available semiconductor wafer. In one embodiment, semiconductor devices such as field effect transistors (not shown) may be formed on a top surface of the substrate 9. The insulating layer 10 includes a dielectric material such as silicon oxide, silicon nitride, at least one dielectric metal oxide, or a combination thereof. In one embodiment, metal interconnect structures such as metal lines and metal vias (not shown) may be embedded in the insulating layer 10 to provide electrical connections among the semiconductor devices on the top surface of the substrate 9.

First electrically conductive lines 12 laterally extending along a first horizontal direction hd1 can be formed in an upper portion of the insulating layer 10. The first electrically conductive lines 12 may be formed, for example, by forming line trenches that laterally extend along a first horizontal direction in an upper portion of the insulating layer 10, and by depositing and planarizing at least one conductive material. The at least one conductive material may include a metallic liner material such as TiN, TaN, and/or WN and a metallic fill material such as W, Cu, Co, Mo, Ru, another metal, or an intermetallic ally. Alternatively, at least one conductive material can be deposited over a planar surface of the insulating material layer, and can be patterned to form the first electrically conductive lines 12. In this case, an additional insulating material can be deposited between the first electrically conductive lines 12, and can be subsequently planarized to provide top surfaces that are coplanar with the top surfaces of the first electrically conductive lines 12. The additional insulating material can be incorporated into the insulating layer 10.

In one embodiment, the first electrically conductive lines 12 may be formed as a periodic structure, i.e., as a one-dimensional periodic array of first electrically conductive lines 12. In this case, the first electrically conductive lines 12 can have a first uniform pitch along a second horizontal direction hd2 that is perpendicular to the first horizontal direction hd1. In one embodiment, the first electrically conductive lines 12 may have a same vertical cross-sectional shape within vertical planes that perpendicular to the first horizontal plane hd2. The thickness of each first electrically conductive line 12 can be in a range from 5 nm to 600 nm, such as from 20 nm to 100 nm, although lesser and greater thicknesses can also be employed. The width of each first electrically conductive line 12 can be in a range from 5 nm to 300 nm, such as from 20 nm to 100 nm, although lesser and greater widths can also be employed.

Referring to FIGS. 3A and 3B, a two-dimensional array of memory pillar structures 80 can be formed on the first electrically conductive lines 12. The two-dimensional array of memory pillar structures can be formed by depositing a material layer stack including at least one memory material layer and switch device layers over the first electrically conductive lines 12 as planar material layers, and by patterning the material layer stack into the two-dimensional array of memory pillar structures 80. The shape and location of each memory pillar structure 80 can be selected such that a row of memory pillar structures 80 is formed on each first electrically conductive line 12. The two-dimensional array of memory pillar structures 80 may be formed as a rectangular periodic array. The horizontal cross-sectional shape of each memory pillar structure 80 may be rectangular, circular, elliptical, or of any generally curvilinear shape having a closed periphery. Patterning of the material layer stack into the two-dimensional array of memory pillar structures 80 can be performed, for example, by applying and patterning a photoresist layer over the material layer stack such that patterned portions of the photoresist layer cover a two-dimensional array, and by performing an anisotropic etch process that transfers the pattern in the photoresist portions through the material layer stack. The etch chemistry of the terminal step of the anisotropic etch process can be selective to the materials of the first electrically conductive lines 12. The photoresist portions can be subsequently removed, for example, by ashing.

Each patterned portion of the at least one memory material layer constitutes a memory element 81, which is a memory cell including a memory material portion. In one embodiment, the at least one memory material layer, and consequently each memory element 81, includes a memory material that provides at least two different resistivity states depending on programming conditions.

In one embodiment, the at least one memory material layer and the memory elements 81 are MRAM elements, such as a tunneling magnetoresistance material (such as a thin magnesium oxide tunneling dielectric layer) located in a magnetic tunnel junction stack between ferromagnetic free and fixed (i.e., reference) layers. The tunneling dielectric located between a ferromagnetic free layer and a ferromagnetic reference layer provides different magnetoresistive tunneling resistance between a parallel spin alignment state and an antiparallel spin alignment state. An exemplary STT MRAM memory element 81 may comprise a memory stack including a reference layer comprising a CoPt/CoFeB superlattice or substack, a MgO tunneling barrier, and a CoFeB free layer. The thickness of the MRAM memory element 81 stack may be suitably selected, and may be in a range from 5 nm to 60 nm, such as from 10 nm to 30 nm, although lesser and greater thicknesses can also be employed. The free layer may be located above or below the reference layer in the memory element 81 stack. The MRAM memory element 81 is capable of supporting two different configurations of the free layer magnetization direction relative to the reference layer magnetization, providing two different resistances for current flowing through the memory stack. The free layer magnetization direction can be switched to the low resistance state in which the free and reference layers are parallel, by flowing electrical current of one polarity between the reference layer and the free layer. The free layer magnetization direction can be switched to the high resistance in which the free and reference layers are anti-parallel, by flowing opposite polarity electrical current of sufficient magnitude between the free layer and the reference layer. The MRAM memory cell resistance is determined by flowing a lower current through the memory cell which does not disturb the resistance state, but provides sufficient signal-to-noise ratio to discern the resistance state.

In another embodiment, the at least one memory material layer and the memory elements 81 can include ReRAM elements. The ReRAM elements may include a transition metal oxide material that provides different resistivity states through oxygen vacancy migration (such as hafnium oxide, tantalum oxide, tungsten oxide), a transition metal oxide material that functions as a reversible thermo-chemical fuse/antifuse (such as nickel oxide), an electrochemical migration-based programmable metallization material, which is also referred to as a conductive bridging or bridge material (such as copper-doped silicon dioxide glass, silver-doped germanium selenide, or silver-doped germanium sulfide), a tunnel barrier material (such as a memristor material, a Schottky barrier material, a barrier metal cell/vacancy-modulated conductive oxide material (such as titanium oxide), or a praseodymium-calcium-manganese oxide (PCMO) material) or a Mott transition-based metal-insulator transition (MIT) switching device material (such as vanadium oxide or niobium oxide). In another embodiment, the memory material layer and the memory elements 81 can include PCM memory elements, such as a phase change memory material (such as a chalcogenide alloy, e.g., a germanium-antimony-telluride compound), or a superlattice structure that exhibits multiple resistive states through interfacial effects (such as a superlattice of chalcogenide alloys).

In another embodiment, the memory elements 81 can include a PCM memory element including a phase change material. As used herein, a "phase change material" refers to a material having at least two different phases providing different resistivity. For example, each memory element 81 may comprise a memory material portion that contains a phase change material providing different electrical resistivities between an amorphous state and a crystalline state. The at least two different phases can be provided, for example, by controlling the time-dependent temperature profile during a cooling step that follows a heated state to provide an amorphous state having a higher resistivity and a polycrystalline state having a lower resistivity. In this case, the higher resistivity state of the phase change material can be achieved by faster quenching of the phase change material after heating the polycrystalline material to an amorphous solid state and/or to a liquid state, and the lower resistivity state of the phase change material can be achieved by heating the amorphous material followed by controlled cooling of the phase change material from the amorphous state to the polycrystalline state. The phase change material acts as the memory material (i.e., data storage material).

Exemplary phase change materials include, but are not limited to, germanium antimony telluride (GST) compounds such as $Ge_2Sb_2Te_5$ or $GeSb_2Te_4$, germanium antimony compounds, indium germanium telluride compounds, aluminum selenium telluride compounds, indium selenium telluride compounds, and aluminum indium selenium telluride compounds. These compounds (e.g., compound semiconductor material) may be doped (e.g., nitrogen doped GST) or undoped. Thus, the phase change material layer can include, and/or can consist essentially of, a material selected from a germanium antimony telluride compound, a germanium antimony compound, an indium germanium telluride compound, an aluminum selenium telluride compound, an indium selenium telluride compound, or an aluminum indium selenium telluride compound. The thickness of the phase change material layer can be in a range from 5 nm to 600 nm, such as from 20 nm to 300 nm and/or from 40 nm to 150 nm, although lesser and greater thicknesses can also be employed.

The switch device layers include various material layers that can be patterned to provide a two-dimensional array of ovonic threshold switches (OTS) (82, 83, 84, 85, 86) which function as selector elements for the respective memory element 81 in the same memory pillar structures 80. While the memory element 81 is shown as being located below the OTS selector element, in another embodiment shown in FIG. 6A and described below, the memory element 81 is located above the OTS selector element in the same memory pillar structure 80.

The OTS selector element includes a first carbon-containing electrode 92, a second carbon-containing electrode 96 and an ovonic threshold switch material portion 84 located between the first carbon-containing electrode 92 and the second carbon-containing electrode 96. In the first embodiment, the first carbon-containing electrode 92 comprises a first carbon-based electrode 82 and a first metallic layer 83. The second carbon-containing electrode 96 comprises a second metallic layer 85 and a second carbon-based electrode 86.

According to the first embodiment of the present disclosure, the OTS selector element layers can include, from bottom to top, a first carbon-based electrode material layer, a first metallic material layer formed on the first carbon-based electrode material layer, an ovonic threshold selector material layer formed on the first metallic material layer, a second metallic material layer formed on the ovonic threshold selector material layer, and a second carbon-based electrode material layer formed on the second metallic material layer. In this case, each ovonic threshold switch (82, 83, 84, 85, 86) can include, from bottom to top, the first carbon-based electrode 82, the first metallic layer 83 located on the first carbon-based electrode 82, the ovonic threshold switch material portion 84 located on the first metallic layer 83, the second metallic layer 85 located on the ovonic threshold switch material portion 84, and the second carbon-based electrode 86 located on the second metallic layer 85. In one embodiment, each first carbon-based electrode 82 can be a patterned portion of the first carbon-based electrode material layer, each first metallic layer 83 can be a patterned portion of the first metallic material layer, each ovonic threshold switch material portion 84 can be a patterned portion of the ovonic threshold switch material layer, each second metallic layer 85 can be a patterned portion of the second metallic material layer, and each second carbon-based electrode 86 can be a patterned portion of the second carbon-based electrode material layer.

Each ovonic threshold switch material portion 84 within the two-dimensional array of ovonic threshold switches (82, 83, 84, 85, 86) can include any suitable ovonic threshold switch material which exhibits non-linear electrical behavior. As used herein, an ovonic threshold switch material refers to a chalcogen-containing material that displays a non-linear resistivity curve under an applied external bias voltage such that the resistivity of the material decreases with the magnitude of the applied external bias voltage. In other words, the ovonic threshold switch material becomes more conductive under a higher external bias voltage than under a lower external bias voltage. In one embodiment, the chalcogen-containing ovonic threshold switch material layer does not crystallize in a low resistivity state under a voltage above the threshold voltage, and reverts back to a high resistivity state when not subjected to a voltage above a critical holding voltage across the ovonic threshold switch material layer. Thus, the ovonic threshold switch material (OTS material) can be non-crystalline (for example, amorphous) in a high resistivity state, and can remain non-crystalline (for example, remain amorphous) in a low resistivity state during application of a voltage above its threshold voltage across the OTS material.

In one embodiment, the ovonic threshold switch material can comprise an amorphous chalcogenide material which exhibits hysteresis in both the write and read current polarities. The chalcogenide material may contain S, Se, and/or Te chalcogen material alloyed with Si, Ge, Sn, P, As, and/or Sb, and may be doped with B, C, N, O, and/or In. Exemplary ovonic threshold switch materials include SiTe, GeTe, GeSe, or GeSeAs, with atomic compositions for constituent elements ranging from 5 to 95%. The ovonic threshold switch material layer can contain any ovonic threshold switch material. In one embodiment, the ovonic threshold switch material layer can include a compound of at least one Group 14 elements and at least one Group 16 element. In one embodiment, the ovonic threshold switch material can include, and/or can consist essentially of, a material selected from a GeSeAs alloy (e.g., $Ge_{0.01-0.1}As_{0.05-0.7}Se_{0.3-0.7}$, such as $GeO_{0.1}As_{0.35}Se_{0.55}$), GeSeAsTe ("GSAT") alloy (e.g., $Ge_{0.01-0.1}As_{0.05-0.7}Se_{0.3-0.7}Te_{0.03-0.3}$), a GeTeAs alloy, a GeSeTe alloy, a GeSe alloy, a SeAs alloy, a AsTe alloy, a GeTe alloy, a SiTe alloy (e.g., $Si_{0.2}Te_{0.8}$), a SiAsTe alloy, or SiAsSe alloy, with atomic compositions for constituent elements ranging from 5 to 95%. In one embodiment, the ovonic threshold switch material may be undoped or doped with at least one of N, O, C, P, Ge, As, Te, Se, In, or Si In one embodiment, the material of the ovonic threshold switch material layer can be selected such that the resistivity of the selector material therein decreases at least by two orders of magnitude (i.e., by more than a factor of 100) upon application of an external bias voltage that exceeds a critical bias voltage magnitude (also referred to as threshold voltage). In one embodiment, the composition and the thickness of the ovonic threshold switch device layers can be selected such that the critical bias voltage magnitude can be in a range from 1 V to 6 V, although lesser and greater voltages can also be employed for the critical bias voltage magnitude. The thickness of the ovonic threshold switch device layers can be, for example, in a range from 1 nm to 50 nm, such as from 5 nm to 25 nm, although lesser and greater thicknesses can also be employed.

Each first carbon-based electrode 82 and each second carbon-based electrode 86 can include a respective carbon-based conductive material including carbon atoms at an atomic concentration greater than 50%. In one embodiment, the first carbon-based electrodes 82 and the second carbon-based electrodes 86 may include carbon atoms at an atomic concentration in a range from 50% to 100%, such as from 70% to 100% and/or from 80% to 100%. In one embodiment, each of the first carbon-based electrodes 82 and the second carbon-based electrodes 86 comprises a respective material selected from diamond-like carbon (DLC), a carbon nitride material (e.g., nitrogen doped carbon containing 1 to 50 atomic percent nitrogen), and a carbon-rich conductive compound of carbon atoms and non-carbon atoms. Each of the first carbon-based electrodes 82 and second carbon-based electrodes 86 may have a respective thickness in a range from 3 nm to 300 nm, although lesser and greater thicknesses may also be employed.

Each first metallic layer 83 and each second metallic layer 85 can include a respective metallic material having electrical conductivity that is greater than the electrical conductivity of the first carbon-based electrodes 82 and each second carbon-based electrodes 86. In one embodiment, each first metallic layer 83 comprises a first metallic material having electrical conductivity that is at least 10 times (which may be at least 30 times and/or at least 100 times and/or at least 1,000 times, such as 10 to 5,000 times) the electrical conductivity of the first carbon-based electrodes 82, and each second metallic layer 85 comprises a second metallic material having electrical conductivity that is at least 10 times (which may be at least 30 times and/or at least 100 times and/or at least 1,000 times, such as 10 to 5,000 times) the electrical conductivity of the second carbon-based electrodes 86.

Generally, each of the first metallic layers 83 and/or the second metallic layers 85 may comprise, and/or may consist essentially of, a high-conductivity metallic material that has a high electrical conductivity, and thus, is capable of functioning as a current-spreading material that prevents concentration of electrical current in a columnar portion of the ovonic threshold switch material portions 84, and spreads current in the carbon containing layer. In one embodiment, each of the first metallic layers 83 and/or the second metallic layers 85 may comprise, and/or may consist essentially of, an elemental metal, a conductive metallic carbide, or a conductive metallic nitride.

In one embodiment, the first metallic layers 83 and/or the second metallic layers 85 may comprise and/or may consist essentially of a refractory or noble metal. In one embodiment, the first metallic layers 83 and/or the second metallic layers 85 may comprise, and/or may consist essentially of, a respective elemental metal selected from ruthenium, niobium, molybdenum, tantalum, tungsten, titanium or rhenium.

In another embodiment, the first metallic layers 83 and/or the second metallic layers 85 may comprise and/or may consist essentially of an electrically conductive metal carbide, such as tungsten carbide.

In one embodiment, the first metallic layers 83 and/or the second metallic layers 85 may comprise, and/or may consist essentially of, an electrically conductive metal nitride, such as tungsten nitride, titanium nitride, molybdenum nitride or tantalum nitride.

Generally, the first metallic layers 83 and/or the second metallic layers 85 may have a lesser thickness than the first carbon-based electrodes 82 and the second carbon-based electrodes 86. Each of the first metallic layers 83 and/or the second metallic layers 85 may have a respective thickness in a range from 0.2 nm to 10 nm, such as from 0.5 nm to 5 nm, such as from 1 nm to 2 nm, although lesser and greater thicknesses may also be employed. In one embodiment, the ratio of the thickness of the first carbon-based electrodes 82 to the thickness of the first metallic layers 83 may be in a range from 3 to 500, such as from 10 to 100, although lesser and greater ratios may also be employed. In one embodiment, the ratio of the thickness of the second carbon-based electrodes 86 to the thickness of the second metallic layers 85 may be in a range from 3 to 500, such as from 10 to 100, although lesser and greater ratios may also be employed.

In one embodiment, a two-dimensional array of memory pillar structures 80 can be formed on the first electrically conductive lines 12. Each of the memory pillar structures 80 comprises a series connection of a memory material portion 81 and an ovonic threshold switch (82, 83, 84, 85, 86). The ovonic threshold switch (82, 83, 84, 85, 86) comprises a first carbon-based electrode 82, a first metallic layer 83 located on the first carbon-based electrode 82, an ovonic threshold switch material portion 84 located on the first metallic layer 83, a second metallic layer 85 located on the ovonic threshold switch material portion 84, and a second carbon-based electrode 86 located on the second metallic layer 85.

In one embodiment, each ovonic threshold switch (82, 83, 84, 85, 86) has a pillar shape in which sidewalls of the first carbon-based electrode 82 are vertically coincident with sidewalls of the first metallic layer 83, sidewalls of the ovonic threshold switch material portion 84, sidewalls of the second metallic layer 85, and sidewalls of the second carbon-based electrode 86. As used herein, a first surface and a second surface are vertically coincident if the first surface and the second surface overlie or underlie each other, and if the first surface and the second surface are located within a same vertical plane.

In one embodiment, each memory material portion 81 comprises sidewalls that are vertically coincident with the sidewalls of the first carbon-based electrode 82 within a same memory pillar structure 80. In one embodiment, the two-dimensional array of memory pillar structures 80 comprises a two-dimensional array of series connections of a respective memory material portion 81 and a respective ovonic threshold switch (82, 83, 84, 85, 86) that has a first periodicity (i.e., a first pitch) along a first horizontal direction hd1 and has a second periodicity (i.e., a second pitch) along a second horizontal direction hd2. In one embodiment, the second horizontal direction hd2 may be perpendicular to the first horizontal direction hd1. In one embodiment, each of the first pitch and the second pitch may be in a range from 10 nm to 2,000 nm, such as from 30 nm to 600 nm, although lesser and greater dimensions may also be employed for the first pitch and/or the second pitch.

Figure 4A:
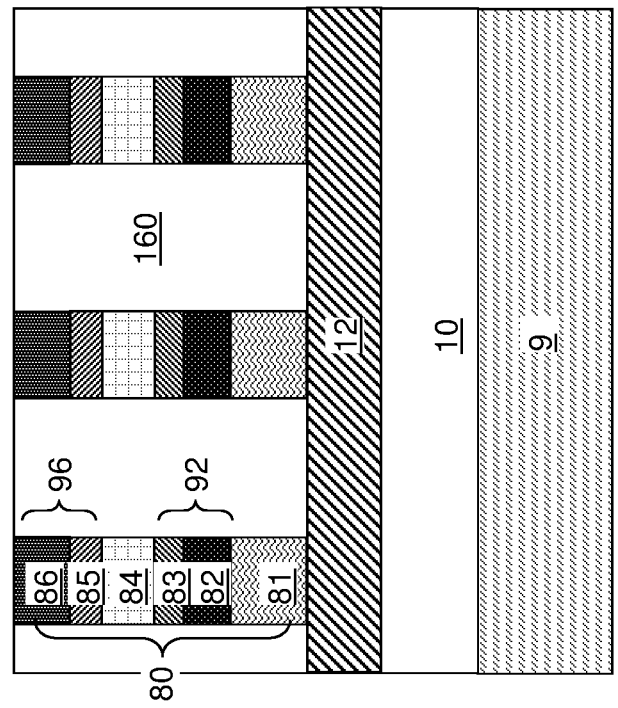
FIG. 4A is a vertical cross-sectional view of the exemplary structure after formation of a dielectric material layer according to the first embodiment of the present disclosure.
Figure 4B:
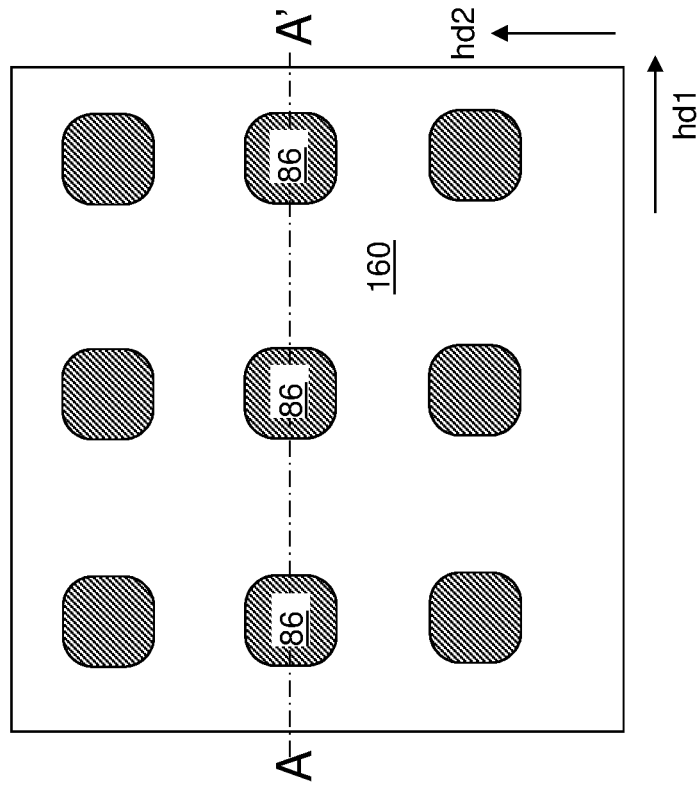
FIG. 4B is a top-down view of the exemplary structure of FIG. 4A. The vertical plane A-A' is the plane of the vertical cross-sectional view of FIG. 4A.

Referring to FIGS. 4A and 4B, a dielectric fill material such as undoped silicate glass (e.g., silicon oxide) or a doped silicate glass can be deposited in the gaps between the memory pillar structures 80 within the two-dimensional array of memory pillar structures 80. The dielectric fill material may be deposited by a conformal deposition process such as a chemical vapor deposition process. Optionally, a reflow process may be performed to remove, or reduce, seams that are formed midway between neighboring pairs of the memory pillar structures 80. Excess portions of the dielectric fill material from above the horizontal plane including the top surfaces of the memory pillar structures 80 by performing a planarization process such as a chemical mechanical polishing (CMP) process. The remaining contiguous portion of the dielectric fill material that laterally surround the two-dimensional array of memory pillar structures 80 constitute a dielectric matrix layer 160.

Referring to FIGS. 5A and 5B, second electrically conductive lines 20 laterally extending along the second horizontal direction hd2 can be formed on top surfaces of the memory pillar structures 180. Each second electrically conductive line 20 can contact top surfaces of a respective subset of the two-dimensional array of memory pillar structures 80. For example, each second electrically conductive line 20 can contact top surfaces of a column of memory pillar structures 80 arranged along the second horizontal direction hd2. In one embodiment, the second electrically conductive lines 20 can be formed by depositing at least one conductive material layer and patterning the at least one conductive material layer into a plurality of line structures that contact a respective column of memory pillar structures 80. In another embodiment, an insulating layer (not shown) can be deposited over the memory pillar structures 80 and the dielectric matrix layer 160, and can be patterned to form line trenches laterally extending along the second horizontal direction. Top surfaces of a column of memory pillar structures 80 can be physically exposed at the bottom of each line trench. At least one conductive material can be deposited in the line trenches and can be subsequently planarized to form the second electrically conductive lines 20. Alternatively, the second electrically conductive lines 20 may be formed first, followed by forming the insulating layer between the second electrically conductive lines 20.

Referring to FIGS. 6A and 6B, an alternative configuration of the exemplary structure can be derived from the exemplary structure by forming the ovonic threshold switch device layers prior to formation of the memory material layer. In this case, the memory element 81 may overlie the ovonic threshold switch (82, 83, 84, 85, 86) within each memory pillar structure 80.

Generally, the first electrically conductive lines 12 can laterally extend along the first horizontal direction hd1, and can be electrically connected to a bottom end of a respective row of series connections within the two-dimensional array of series connections of a respective memory material portion 81 and a respective ovonic threshold switch (82, 83, 84, 85, 86) selector element. The second electrically conductive lines 20 can laterally extend along the second horizontal direction hd2, and can be electrically connected to a top end of a respective column of series connections within the two-dimensional array of series connections of a respective memory material portion 81 and a respective ovonic threshold switch (82, 83, 84, 85, 86) selector element.

According to an aspect of the present disclosure, the first metallic layer 83 and/or the second metallic layer 85 within each ovonic threshold switch (82, 83, 84, 85, 86) selector element can decrease a voltage drop (hereafter referred to as V_off) across the ovonic threshold switch material portion 84 while the ovonic threshold switch material portion 84 is in a conductive state.

Figure 7:
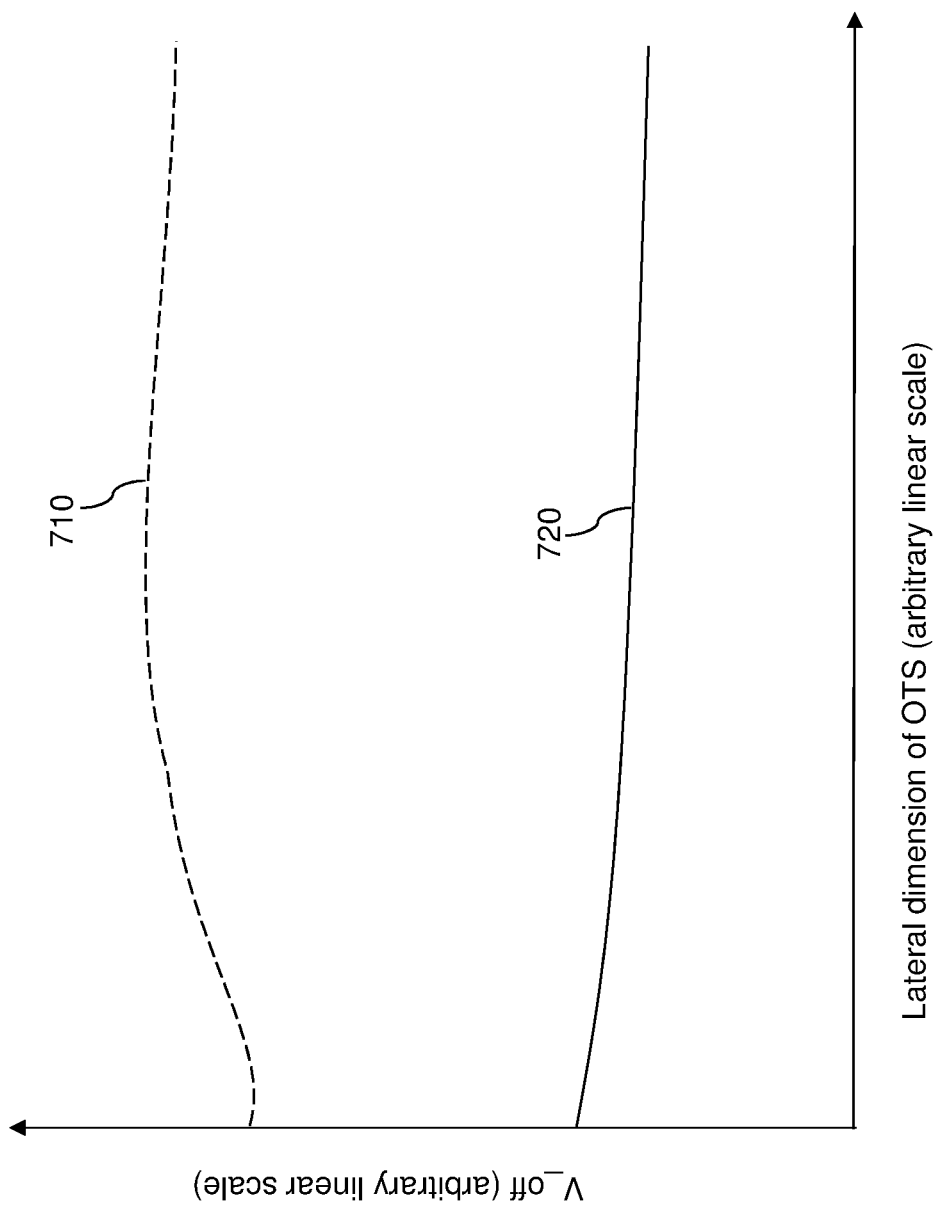
FIG. 7 is a schematic graph illustrating V_off for a comparative exemplary ovonic threshold switch and an ovonic threshold switch according to the first embodiment of the present disclosure.

Referring to FIG. 7, the on-state voltage drop across an ovonic threshold switch material portion is illustrated for a comparative exemplary ovonic threshold switch and an exemplary ovonic threshold switch according to an embodiment of the present disclosure. In this illustrative example, the comparative exemplary ovonic threshold switch is derived from the ovonic threshold switch of the first embodiment of the present disclosure by omitting the first metallic layer 83 and the second metallic layer 85. Thus, the comparative exemplary ovonic threshold switch consists of the first carbon-based electrode, the ovonic threshold switch material portion, and the second carbon-based electrode. The exemplary ovonic threshold switch according to the first embodiment of the present disclosure comprises, from one side to another, the first $CN_x$ carbon-based electrode 82, the first TiN metallic layer 83, the GSAT ovonic threshold switch material portion 84, the second TiN metallic layer 85, and the second $CN_x$ carbon-based electrode 86 as described above. For the purpose of comparison, the dimensions and material compositions of each of the first carbon-based electrodes 82, the ovonic threshold switch material portions 84, and the second carbon-based electrodes 86 are the same across the comparative exemplary ovonic threshold switch and the exemplary ovonic threshold switch of the present disclosure.

A first curve 710 illustrates the on-state voltage drop V_off across the ovonic threshold switch material portion for the comparative exemplary ovonic threshold switch, and a second curve 720 illustrates the on-state voltage drop across the ovonic threshold switch material portion 84 for the exemplary ovonic threshold switch. The magnitude of the on-state voltage drop V_off 710 across the ovonic threshold switch material portion for the comparative exemplary ovonic threshold switch may be 0.2 V to 1.2 V greater than the on-state voltage drop V_off 720 across the ovonic threshold switch material portion 84 of the exemplary ovonic threshold switch (82, 83, 84, 85, 86) according to the first embodiment of the present disclosure.

Generally, the ovonic threshold switch (82, 83, 84, 85, 86) operates as a thresholding device that switches between an insulating state and a conducting state depending on whether the applied external bias voltage is greater than a threshold voltage (Vt). Once the ovonic threshold switch (82, 83, 84, 85, 86) selector element is turned on, a residual voltage drop (which is the on-state voltage drop V_off) is present across the ovonic threshold switch material portion 84 along with intrinsic to the OTS voltage drop of the conductive state. The on-state voltage drop V_off is a parasitic voltage drop across the two electrodes of the ovonic threshold switch (82, 83, 84, 85, 86) selector element that is present when the ovonic threshold switch material portion 84 functions as a conductive element.

Use of carbon-based materials for the first electrode and the second electrode of the ovonic threshold switch (82, 83, 84, 85, 86) selector element can facilitate scaling and fabrication of the ovonic threshold switch (82, 83, 84, 85, 86) selector element. However, the high resistance of carbon-based materials can significantly increase the on-state voltage drop V_off. An increase in the on-state voltage drop V_off can induce formation of filamentary-type conduction paths within the ovonic threshold switch material portion 84, and can further exacerbate the on-state voltage drop V_off by inducing a point-like current injection pattern into the ovonic threshold switch material portion 84. The current injection region within the OTS electrodes may have a funnel-shape, and only a small fraction of the volume of the electrodes is used for electrical current conduction during an on-state and the parasitic voltage drop in the electrodes increases.

According to the first embodiment of the present disclosure, the first metallic layer 83 and/or the second metallic layer 85 of the ovonic threshold switch (82, 83, 84, 85, 86) selector element induces current spreading across the entire volume of the first carbon-based electrode 82 and the second carbon-based electrode 86. Accordingly, the on-state voltage drop V_off of the ovonic threshold switch (82, 83, 84, 85, 86) selector element of the first embodiment of the present disclosure can be reduced relative to the on-state voltage drop V_off of the comparative exemplary ovonic threshold switch selector element that does not employ metallic layers therein.

In summary, the voltage drop across the electrodes is reduced because the current is spread by the metallic layers (83, 85). The threshold voltage is also lower, but is shunted with the high resistance of the ovonic threshold switch material portion 84 (e.g., GSAT, etc. portion). V_off is also lower because the non-linear part is reduced to the larger effective active area of the electrodes. The parasitic voltage drop is also decreased and/or eliminated. Therefore, the write quality of the memory element 81, such as an MRAM cell, can be improved.

In the second embodiment, rather than forming separate metallic layers and carbon-based electrodes of the first embodiment, each electrode comprises an alloy containing a metal and carbon. The alloy increases the conductivity of the electrodes. Therefore, separate metallic layers of the first embodiment are not required to increase the conductivity and current spreading of the carbon-based electrodes.

FIGS. 8A and 8B illustrate alternative memory pillar structures 80A and 80B according to the second embodiment. In FIG. 8A, the memory element 81 is located below the OTS selector element. In FIG. 8B, the memory element 81 is located above the OTS selector element. The memory pillar structures 80A and 80B of FIGS. 8A and 8B can be derived from the respective memory pillar structures 80 of FIGS. 5A and 6A by replacing the metallic layers (83, 85) and the carbon based electrodes (82, 86) with first and second metal-carbon alloy electrodes (182, 186). In the second embodiment, the first carbon-containing electrode 92 comprises a first metal-carbon alloy electrode 182 and the second carbon-containing electrode 96 comprises a second metal-carbon alloy electrode 186.

The first and second metal-carbon alloy electrodes (182, 186) may contain 1 to 50 atomic percent metal, such as 5 to 25 atomic percent metal, and remainder carbon and optionally nitrogen and unavoidable impurities. For example, the first and second metal-carbon alloy electrodes (182, 186) may contain 1 to 50 atomic percent metal, such as 5 to 25 atomic percent metal, and 70 to 99 atomic percent carbon, such as 75 to 95 atomic percent carbon. Alternatively, the first and second metal-carbon alloy electrodes (182, 186) may contain 1 to 50 atomic percent metal, such as 5 to 25 atomic percent metal, 10 to 40 atomic percent nitrogen, and 50 to 85 atomic percent carbon, such as 60 to 80 atomic percent carbon. The metal in the metal-carbon alloy may be selected from one or more of ruthenium, niobium, molybdenum, tantalum, tungsten, titanium or rhenium. For example, the alloy may comprise 1 to 50 atomic percent tungsten and remainder carbon, or 1 to 50 atomic percent titanium and remainder carbon and nitrogen (e.g., an alloy of carbon and titanium nitride, i.e., titanium carbonitride).

The metal-carbon alloys may be produced by chemical vapor deposition or physical vapor deposition. For example, the alloys may be produced by co-sputtering from metal and carbon targets or by sputtering from a composite metal-carbon alloy target.

Adding a metal to the carbon-based electrodes reduces the electrode resistivity. Thus, current spreading in lower resistivity material provides a more uniform current density across the electrode material. This improves both the threshold voltage Vt and the magnitude and distribution of V_off. Thus, the relatively high conductivity current metal-carbon alloy electrodes function as the current spreading layer.

Figure 9A:
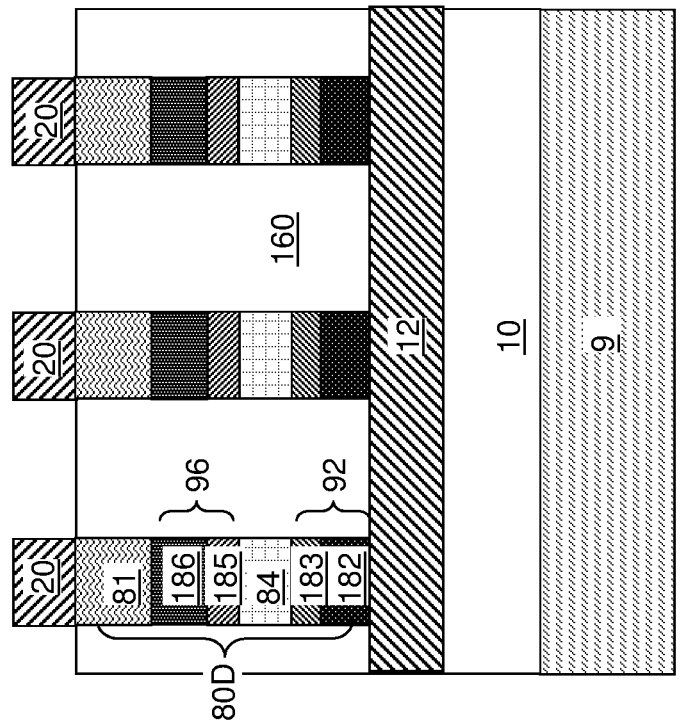
FIGS. 9A and 9B are vertical cross-sectional view of alternative configurations of a third exemplary structure after formation of second conductive lines according to a third embodiment of the present disclosure.
Figure 9B:
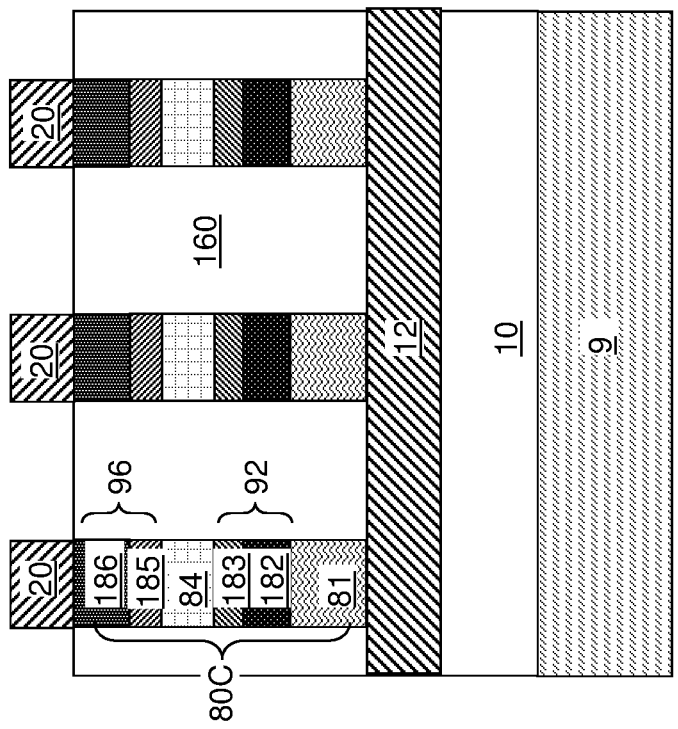

FIGS. 9A and 9B illustrate alternative memory pillar structures 80C and 80D according to the second embodiment. In FIG. 9A, the memory element 81 is located below the OTS selector element. In FIG. 9B, the memory element 81 is located above the OTS selector element. The memory pillar structures 80C and 80D of FIGS. 9A and 9B can be derived from the respective memory pillar structures 80A and 80B of FIGS. 8A and 8B by adding electrically conductive first and second barrier layers (183, 185) between the ovonic threshold switch material portion 84 and the respective first and second metal-carbon alloy electrodes (182, 186). In the third embodiment, the first carbon-containing electrode 92 comprises the first metal-carbon alloy electrode 182 and a first barrier layer 183. The second carbon-containing electrode 96 comprises the second metal-carbon alloy electrode 186 and the second barrier layer 185.

For example, the metal, such as tungsten, from the metal-carbon alloy electrodes (182, 186) may undesirably diffuse into the ovonic threshold switch material portion 84 during device operation. Such mixing of metal atoms into the chalcogenide material of the ovonic threshold switch material portion 84 may negatively impact the selector element operation, increase leakage, reduce cycling capability, negatively impact endurance, and even possibly remove thresholding features from the device current-voltage curve.

In contrast, the material of the barrier layers (183, 185) is typically stable in contact with the ovonic threshold switch material portion 84, does not provide significant diffusion in atoms into the ovonic threshold switch material portion 84, and acts as a diffusion barrier to prevent or reduce metal (e.g., tungsten) diffusion from the metal-carbon alloy electrodes (182, 186) into the ovonic threshold switch material portion 84.

The barrier layers (183, 185) may comprise titanium nitride and/or a carbon-based material, such as diamond-like carbon or nitrogen doped carbon. In one embodiment, each of the barrier layers (183, 185) may comprise a bi-layer containing a TiN sublayer and a carbon-based sublayer. If the bi-layer barrier layers are used, then either the TiN sublayer or the carbon-based sublayer may contact the ovonic threshold switch material portion 84. The barrier layers (183, 185) are preferably thinner than the metal-carbon alloy electrodes (182, 186). For example, the barrier layers (183, 185) may have a thickness of 0.5 nm to 20 nm, such as 1 nm to 10 nm, for example 1 nm to 5 nm.

In an alternative configuration of the third embodiment, since the opposing surfaces of the ovonic threshold switch material portion 84 are protected by the barrier layers (183, 185), the material of the electrodes (182, 186) may comprise a metallic material which contains more than 50 atomic percent metal, such as 60 to 100 atomic percent metal. The electrodes (182, 186) may optionally contain 0 to 40, such as 1 to 40 atomic percent carbon and/or nitrogen. The metal of the metallic electrodes (182, 186) may comprise ruthenium, niobium, molybdenum, tantalum, tungsten, titanium or rhenium.

Figure 10:
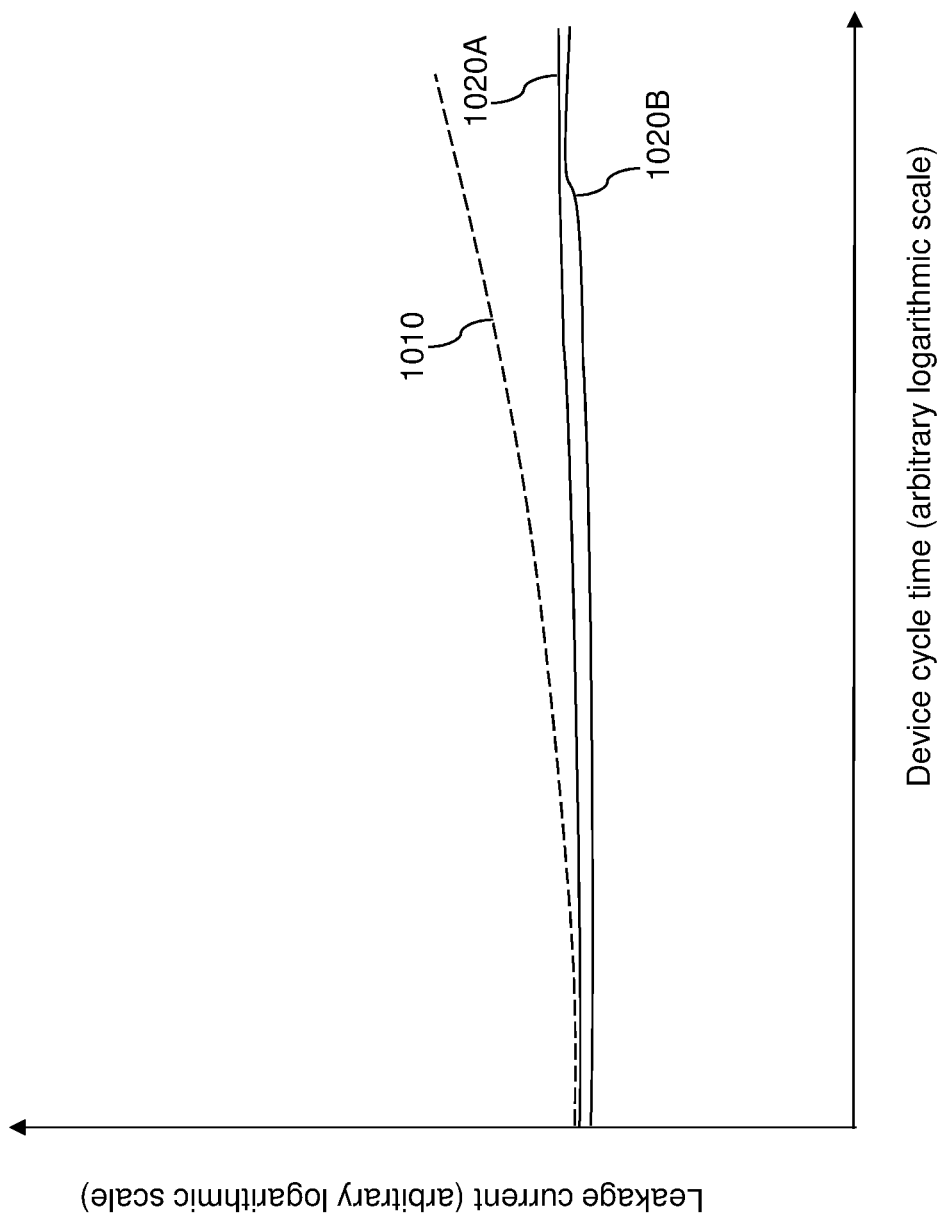
FIG. 10 is a schematic graph illustrating leakage current as a function of device cycle time for a comparative exemplary ovonic threshold switch and an ovonic threshold switch according to the third embodiment of the present disclosure.

Referring to FIG. 10, leakage current during an off state (i.e., when the ovonic threshold switch material portion is in the insulating state at Vt) as a function of the number of device cycles between the on state and the off state is illustrated for the comparative exemplary ovonic threshold switch and the ovonic threshold switch selector elements of the third embodiment of the present disclosure. All three selector elements include GSAT ovonic threshold switch material portion 84 and tungsten carbide electrodes (182, 186). However, the ovonic threshold switch selector elements of the third embodiment of the present disclosure also include either 10 nm nitrogen doped carbon barrier layers (183, 185) or a bi-layer containing 2 nm TiN and 10 nm nitrogen doped carbon barrier layers (183, 185).

A first curve 1010 illustrates the off-state leakage current across the comparative exemplary ovonic threshold switch selector element, and a second and third curves 1020A and 1020B illustrate the off-state leakage current across the exemplary ovonic threshold switch selector elements of the third embodiment. As shown in FIG. 10, the first curve 1010 shows an increasing leakage current as the number of cycles increases, which is believed to be due to diffusion of tungsten from tungsten carbide alloy electrodes into the ovonic threshold switch material portion 84. However, the second and third curves 1020A and 1020B have a smaller increase in leakage current as the number of cycles increases. Without wishing to be bound by a particular theory, it is believed that the reduction in leakage current results because the barrier layers prevent or reduce the tungsten diffusion from the tungsten carbide electrodes into the ovonic threshold switch material portion 84. Thus, the endurance of the selector element of the third embodiment may be at least $10^8$ cycles.

Thus, the structures and methods of the embodiments of the present disclosure can provide an ovonic threshold switch selector element providing a superior device performance both in terms of the on-state voltage drop and the off-state leakage current.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:
a memory material portion; and
an ovonic threshold switch selector element, wherein the ovonic threshold switch selector element comprises:
a first carbon-containing electrode comprising carbon and a metal;
a second carbon-containing electrode comprising the carbon and the metal; and
an ovonic threshold switch material portion located between the first electrode and the second electrode;
wherein:
the first carbon-containing electrode comprises a first carbon-based electrode and a first metallic layer;
the second carbon-containing electrode comprises a second metallic layer and a second carbon-based electrode;
the ovonic threshold switch selector element comprises:
the first carbon-based electrode;
the first metallic layer located on the first carbon-based electrode;
the ovonic threshold switch material portion located on the first metallic layer;
the second metallic layer located on the ovonic threshold switch material portion; and
the second carbon-based electrode located on the second metallic layer; and
each of the first carbon-based electrode and the second carbon-based electrode comprises carbon atoms at an atomic concentration greater than 50%.

2. The memory device of claim 1, wherein each of the first carbon-based electrode and the second carbon-based electrode comprises a respective material selected from diamond-like carbon (DLC), a nitrogen doped carbon material, or a carbon-rich conductive compound of carbon atoms and non-carbon atoms.

3. A memory device, comprising:
a memory material portion; and
an ovonic threshold switch selector element, wherein the ovonic threshold switch selector element comprises:
a first carbon-containing electrode comprising carbon and a metal;
a second carbon-containing electrode comprising the carbon and the metal; and
an ovonic threshold switch material portion located between the first electrode and the second electrode;
wherein:
the first carbon-containing electrode comprises a first carbon-based electrode and a first metallic layer;
the second carbon-containing electrode comprises a second metallic layer and a second carbon-based electrode;
the ovonic threshold switch selector element comprises:
the first carbon-based electrode;
the first metallic layer located on the first carbon-based electrode;
the ovonic threshold switch material portion located on the first metallic layer;
the second metallic layer located on the ovonic threshold switch material portion; and
the second carbon-based electrode located on the second metallic layer; and
at least one of the first metallic layer and the second metallic layer consists essentially of tungsten carbide.

4. A memory device, comprising:
a memory material portion; and
an ovonic threshold switch selector element, wherein the ovonic threshold switch selector element comprises:
a first carbon-containing electrode comprising carbon and a metal;

a second carbon-containing electrode comprising the carbon and the metal; and
an ovonic threshold switch material portion located between the first electrode and the second electrode;
wherein:
the first carbon-containing electrode comprises a first carbon-based electrode and a first metallic layer;
the second carbon-containing electrode comprises a second metallic layer and a second carbon-based electrode;
the ovonic threshold switch selector element comprises:
the first carbon-based electrode;
the first metallic layer located on the first carbon-based electrode;
the ovonic threshold switch material portion located on the first metallic layer;
the second metallic layer located on the ovonic threshold switch material portion; and
the second carbon-based electrode located on the second metallic layer;
a ratio of a thickness of the first carbon-based electrode to a thickness of the first metallic layer is in a range from 3 to 500; and
a ratio of a thickness of the second carbon-based electrode to a thickness of the second metallic layer is in a range from 3 to 500.

5. A memory device, comprising:
a memory material portion; and
an ovonic threshold switch selector element, wherein the ovonic threshold switch selector element comprises:
 a first carbon-containing electrode comprising carbon and a metal;
 a second carbon-containing electrode comprising the carbon and the metal; and
an ovonic threshold switch material portion located between the first electrode and the second electrode;
wherein:
the first carbon-containing electrode comprises a first carbon-based electrode and a first metallic layer;
the second carbon-containing electrode comprises a second metallic layer and a second carbon-based electrode;
the ovonic threshold switch selector element comprises:
the first carbon-based electrode;
the first metallic layer located on the first carbon-based electrode;
the ovonic threshold switch material portion located on the first metallic layer;
the second metallic layer located on the ovonic threshold switch material portion; and
the second carbon-based electrode located on the second metallic layer;
the first metallic layer has a thickness in a range from 0.2 nm to 10 nm; and
the second metallic layer has a thickness in a range from 0.2 nm to 10 nm.

6. A memory device, comprising:
a memory material portion; and
an ovonic threshold switch selector element, wherein the ovonic threshold switch selector element comprises:
 a first carbon-containing electrode comprising carbon and a metal;
 a second carbon-containing electrode comprising the carbon and the metal; and
 an ovonic threshold switch material portion located between the first electrode and the second electrode;
wherein:
the first carbon-containing electrode comprises a first metal-carbon alloy electrode;
the second carbon-containing electrode comprises a second metal-carbon alloy electrode;
the first metal-carbon alloy electrode comprises 1 to 50 atomic percent metal and 70 to 99 atomic percent carbon; and
the second metal-carbon alloy electrode comprises 1 to 50 atomic percent metal and 70 to 99 atomic percent carbon.

7. A memory device, comprising:
a memory material portion; and
an ovonic threshold switch selector element, wherein the ovonic threshold switch selector element comprises:
 a first carbon-containing electrode comprising carbon and a metal;
 a second carbon-containing electrode comprising the carbon and the metal; and
 an ovonic threshold switch material portion located between the first electrode and the second electrode;
wherein:
the first carbon-containing electrode comprises a first metal-carbon alloy electrode; and
the second carbon-containing electrode comprises a second metal-carbon alloy electrode;
the first metal-carbon alloy electrode comprises 1 to 50 atomic percent metal, 10 to 40 atomic percent nitrogen, and 50 to 85 atomic percent carbon; and
the second metal-carbon alloy electrode comprises 1 to 50 atomic percent metal, 10 to 40 atomic percent nitrogen, and 50 to 85 atomic percent carbon.

* * * * *